United States Patent
Toth et al.

(10) Patent No.: US 8,617,668 B2
(45) Date of Patent: Dec. 31, 2013

(54) METHOD OF USING NITROGEN BASED COMPOUNDS TO REDUCE CONTAMINATION IN BEAM-INDUCED THIN FILM DEPOSITION

(75) Inventors: Milos Toth, Portland, OR (US);
Charlene Lobo, Hillsboro, OR (US);
Steven Randolph, Portland, OR (US);
Clive Chandler, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 12/565,707

(22) Filed: Sep. 23, 2009

(65) Prior Publication Data
US 2011/0070381 A1    Mar. 24, 2011

(51) Int. Cl.
*C23C 14/28*    (2006.01)

(52) U.S. Cl.
USPC ............ 427/585; 427/586; 427/590; 427/597

(58) Field of Classification Search
USPC .......... 427/585, 586, 589, 590, 595, 596, 597
See application file for complete search history.

(56) References Cited

U.S. PATENT DOCUMENTS

| | | | | |
|---|---|---|---|---|
| 4,266,985 A | * | 5/1981 | Ito et al. | 438/289 |
| 4,522,886 A | * | 6/1985 | Chin et al. | 428/446 |
| 4,605,566 A | | 8/1986 | Matsui et al. | |
| 4,735,921 A | * | 4/1988 | Soukiassian | 438/765 |
| 4,845,054 A | | 7/1989 | Mitchener | |
| 4,876,112 A | | 10/1989 | Kaito et al. | |
| 4,950,498 A | | 8/1990 | Kaito | |
| 5,055,696 A | | 10/1991 | Haraichi et al. | |
| 5,083,033 A | | 1/1992 | Komano et al. | |
| 5,104,684 A | | 4/1992 | Tao et al. | |
| 5,196,102 A | | 3/1993 | Kumar | |
| 5,407,710 A | * | 4/1995 | Baum et al. | 427/555 |
| 5,482,802 A | | 1/1996 | Celler et al. | |
| 5,508,368 A | * | 4/1996 | Knapp et al. | 427/534 |

(Continued)

FOREIGN PATENT DOCUMENTS

| | | | |
|---|---|---|---|
| DE | 3513633 A1 | * | 10/1986 |
| JP | 60046372 | | 3/1985 |

(Continued)

OTHER PUBLICATIONS

Wengenmair, H., et al., "Photon and ion beam assisted deposition of titanium nitride". Applied Surface Science 99 (1996) pp. 313-318.*

(Continued)

*Primary Examiner* — Bret Chen
(74) *Attorney, Agent, or Firm* — Scheinberg & Associates, PC; Michael O. Scheinberg; John B. Kelly (57) ABSTRACT

A method of depositing a material on a work piece surface. The method comprising providing a deposition precursor gas at the work piece surface; providing a purification compound including a nitrogen-containing compound at the work piece surface; and directing a beam toward a local region on the work piece surface, the beam causing decomposition of the precursor gas to fabricate a deposit on the work piece surface, the deposited material including a contaminant, the purification compound causing a reduction in the concentration of the contaminant and providing a deposited material that includes less contamination than a material deposited using the same methodology but without using a purification compound.

25 Claims, 5 Drawing Sheets

(56) References Cited

U.S. PATENT DOCUMENTS

| | | | |
|---|---|---|---|
| 5,700,526 | A | 12/1997 | Ximen et al. |
| 5,741,557 | A * | 4/1998 | Corbin et al. ............... 427/469 |
| 5,824,598 | A | 10/1998 | Yamaguchi et al. |
| 5,827,786 | A | 10/1998 | Puretz |
| 5,948,541 | A * | 9/1999 | Inspektor ................... 428/469 |
| 5,976,976 | A | 11/1999 | Doan et al. |
| 6,042,738 | A | 3/2000 | Casey, Jr. et al. |
| 6,159,867 | A | 12/2000 | Sharan et al. |
| 6,211,527 | B1 | 4/2001 | Chandler |
| 6,261,850 | B1 | 7/2001 | Marsh |
| 6,268,608 | B1 * | 7/2001 | Chandler .................. 250/492.2 |
| 6,319,567 | B1 * | 11/2001 | Senzaki et al. .............. 427/565 |
| 6,331,493 | B1 * | 12/2001 | Sharan ....................... 438/765 |
| 6,492,261 | B2 | 12/2002 | Gavish et al. |
| 6,753,538 | B2 | 6/2004 | Musil et al. |
| 6,838,380 | B2 | 1/2005 | Bassom et al. |
| 7,374,701 | B2 | 5/2008 | Hwang et al. |
| 7,670,956 | B2 | 3/2010 | Bret et al. |
| 2003/0029836 | A1 * | 2/2003 | Lindstrom et al. ............. 216/67 |
| 2003/0161970 | A1 * | 8/2003 | Kaito .......................... 427/595 |
| 2005/0000937 | A1 | 1/2005 | Chiang et al. |
| 2005/0011457 | A1 | 1/2005 | Chiang et al. |
| 2005/0183667 | A1 * | 8/2005 | Keller et al. ............... 118/723 I |
| 2005/0183669 | A1 * | 8/2005 | Parkhe et al. ................. 118/724 |
| 2006/0033160 | A1 * | 2/2006 | Findikoglu et al. ........... 257/347 |
| 2006/0045987 | A1 | 3/2006 | Chandler et al. |
| 2007/0054431 | A1 * | 3/2007 | Kamikawa et al. ............. 438/39 |
| 2008/0314871 | A1 | 12/2008 | Toth et al. |

FOREIGN PATENT DOCUMENTS

| | | | |
|---|---|---|---|
| JP | 2-274867 | * | 11/1990 |
| JP | 03-016127 | | 1/1991 |
| JP | 09-120962 | | 5/1997 |
| JP | 10090876 | | 4/1998 |
| WO | 9738355 | | 10/1997 |
| WO | WO2008098084 | | 8/2008 |

OTHER PUBLICATIONS

Yokota, Katsuhiro, et al., "Resistivities of titanium nitride films prepared onto silicon by an ion beam assisted deposition method". J. Phys. D: Appl. Phys. 37 (2004) pp. 1095-1101.*

Lu, Ming, et al., "Electrical properties of boron nitride thin films grown by neutralized nitrogen ion assisted vapor deposition". Appl. Phys. Lett. 68 (5), Jan. 29, 1996, pp. 622-624.*

Gerlach, J.W., et al., "Ion Beam Assisted Deposition Induced Composition Changes in Titanium Nitride". Phys. stat. sol. (a) 155, pp. 181-188 (1996).*

Chen, K.H., et al., "Wide band gap silicon carbide nitride films deposited by electron cyclotron resonance plasma chemical vapor deposition". Thin Solid Films, 355-356 (1999) pp. 205-209.*

Folch, Albert, "Electron Beam Deposition of Gold Nanostructures in a Reactive Environment," Appl.Phys. Lett, Apr. 17, 1995, pp. 2080-2082, vol. 66, Iss. 16.

Molhave, Kristian, et al., "Solid Gold Nanostructures Fabricated by Electron Beam Deposition," Nano Letters, 2003, pp. 1499-1503, vol. 3, No. 11.

Sun, Y.-M., et al., "Electron-Induced Nitridation of GaAs(100) with Ammonia," J. Vac. Sci Technol. B, May/Jun. 1993, pp. 610-613, vol. 11, No. 3.

Hubner, A., et al., "GaN Patterned Film Synthesis: Carbon Depletion by Hydrogen Atoms Produced from NH3 Activated by Electron Impact," J. Vac. Sci Technol. A, Jul./Aug. 1995, pp. 1831-1936, vol. 13, No. 4.

Toth, Milos, et al. "Secondary Electron Imaging at Gas Pressures in Excess of 1 kPa," Applied Physics Letters, 2007, 3 pages, vol. 91.

Toth, Milos et al., "Nanostructure Fabrication by Ultra-High-Resolution Environmental Scanning Electron Microscopy," Nano Letters, 2007, pp. 525-530, vol. 7, No. 2.

Thiel, Bradley L., et al., "Secondary Electron Contrast in Low-Vacuum/Environmental Scanning Electron Microscopy of Dielectrics," Journal of Applied Physics, 2005, 18 pages, vol. 97.

Choi, Jong Hyung, et al., "Density Control of Carbon Nanotubes Using NH3 Plasma Treatment of Ni Catalyst Layer," Thin Solid Films, 2003, pp. 318-323, vol. 435.

Fan, Ching-Lin, "Organic Thin-Film Transistor Performance Improvement Using Ammonia (NH3) Plasma Treatment on the Gate Insulator Surface," Solid-State Electronics, Jan. 17, 2009, pp. 246-250, vol. 53.

Koleske, D.D., et al., "Influence of MOVPE Growth Conditions on Carbon and Silicon Concentrations in GaN," Journal of Crystal Growth, 2002, pp. 55-69, vol. 242.

Stanishevsky, A., "Patterning of Diamond and Amorphous Carbon Films Using Focused Ion Beams," This Solid Films, 2001, pp. 560-565, vols. 398-399.

Wang, Shuxia, et al., "Effects of NH3 Plasma Pretreatment on the Growth of Carbon Nanotubes," Diamond and Related Materials, 2006, pp. 361-364, vol. 15.

Sung, Myung, M., et al., 'Chemical-Beam Deposition of GaN Films on Si(111) from Diethylazidogallium Methylhydrazine Adduct,' J. Vac. Sci. Technol. A, May/Jun. 2004, pp. 461-464, vol. 22, Iss. 3.

* cited by examiner

METHOD OF USING NITROGEN BASED COMPOUNDS TO REDUCE CONTAMINATION IN BEAM-INDUCED THIN FILM DEPOSITION

TECHNICAL FIELD OF THE INVENTION

The present invention relates to beam-induced processing, such as deposition and etching using particle beams or laser beams.

BACKGROUND AND SUMMARY OF THE INVENTION

A number of important areas of technology, such as the fabrication of integrated circuits, solar cells, flat panel displays, etc., involve the use of chemical vapor deposition (CVD) techniques to deposit approximately uniform films over one or more entire surfaces of a work piece, such as a semiconductor wafer, or flat panel display. CVD typically employs a susceptor on which a work piece is placed within a CVD process chamber and then heated to temperatures high enough to induce thermal decomposition of one or more deposition precursor gases. In CVD, the film is inherently formed over the entire surface of the work piece since deposition is induced by the high (and necessarily fairly uniform) temperature of the entire work piece. Generally, work piece temperatures must be uniform to avoid excessive thermally-induced stresses within the work piece during CVD, and to ensure uniform composition and thickness of the deposited material. During device fabrication, in addition to the CVD processes outlined above, plasma-enhanced etch processes are typically also employed, where one or more entire surfaces of a work piece are etched, usually through openings in a patterned resist layer.

Many fabrication applications, such as nanotechnology, however, require a method for selective, or patterned, deposition or etching, i.e., a process in which only certain regions of a work piece will be deposited on or etched, not the entire work piece surface as in CVD or plasma-enhanced etching. Such processes require some method of local decomposition of the deposition or etch precursor gas. Laser beams, electron beams, and ion beams have all been used for these processes. For example, charged particle beams, such as electron beams, ion beams, or cluster beams, are used to deposit a metal by decomposing a precursor gas, such as an organometallic compound. Charged particle beams are also used to etch materials, using a precursor such as iodine or xenon difluoride, that combines with the work piece material in the presence of the beam to produce volatile byproducts. Charged particle beams can be focused to sub-micron spots, and can therefore be used to create precise, arbitrary structures by deposition or etching, by scanning the beam in a desired pattern while the beam etches or induces deposition.

A major problem with materials fabricated by beam-induced deposition is their purity is typically very low, often less than 50%, compared to that of materials grown by CVD. Numerous methods have been attempted to improve the purity of materials grown by beam-induced deposition. For example, Folch et al., "Electron Beam Deposition of Gold Nanostructures in a Reactive Environment," *Applied Physics Letters* 66(16) pp. 2080-82 (1995), discusses the use of an environmental scanning electron microscope system to deposit gold nanostructures in a "reactive" environment comprised of a reactive gas other than the growth precursor, using an electron beam-induced deposition (EBID) process. An organometallic compound [Au(CH$_3$)$_2$(hexafluoroacetylacetonate)] served as the deposition precursor, and the work piece for film growth was indium-tin-oxide at room temperature. The deposition is performed in an oxidative environment containing either H$_2$O vapor or a mixture of 80% Ar and 20% O$_2$ (Ar/O$_2$) (in the case of the latter, the Ar is a noble species which plays no part in the reaction). Folch et al. found that either of H$_2$O or Ar/O$_2$ reduced the carbon content of the deposited gold film, while pure Ar did not. The authors believe that carbon from within the growing gold film is removed through the formation of CO and CO$_2$ molecules, which are volatile at room temperature, simultaneously with Au film growth.

Molhave et al., "Solid Gold nanostructure Fabrication by Electron Beam Deposition," *Nano Letters.*, vol. 3, no. 11, pp. 1499-1503 (2003) also employs an environmental scanning electron microscope to deposit gold nanostructures using [Au(CH$_3$)$_2$(hexafluoroacetylacetonate)] precursor in a water vapor environment. Molhave et al. found that the H$_2$O environment enabled growth of polycrystalline gold cores (gold pillars created by the electron beam in their experiments). Molhave et al. also attempted unsuccessfully to grow gold cores in a reductive environment of 60% He/40% H$_2$, and an oxidative environment of 80% Ar/20% O$_2$. These results illustrate that not all gases that are reductive or oxidative can improve substantially the quality of the deposited film. Applicants' interpretation of the results published by Molhave et al. is that O$_2$ and H$_2$ have surface residence times and cross-sections for electron beam-induced dissociation that are too low to effectively purify the deposited structure by volatilising carbon (through the formation of either CH$_x$ or CO$_x$ species in the case of H$_2$ and O$_2$ respectively). Molhave et al. and Folch et al. describe oxidative environments for assisting deposition.

A problem with prior art material purification methods such as those described above is that they reduce the volumetric growth rates of beam-induced deposition processes. This is a major shortcoming because the growth rates of beam-induced deposition processes are very low compared to other growth methods such as CVD. The low growth rates limit the applicability and usefulness of beam-induced deposition.

Sun, et al., "Electron-induced Nitridation of GaAs (100) with Ammonia" *J. Vac. Sci. Technol., B,* 11(3), pp. 610-613 (1993) describes using an ammonia precursor to form a film of GaN on a GaAs substrate under electron beam irradiation. Hubner et al., "GaN Patterned Film Synthesis: Carbon Depletion by Hydrogen Atoms Produced from NH$_3$ Activated by Electron Impact," *J. Vac. Sci. Technol., A* 13(4), pp. 1831-1936 (1995) describes a process for using trimethylgallium (TMG) and NH$_3$, activated by electron impact, as precursors for GaN formation. The Hubner et al. process is performed at a temperature of 108 K, which was required to adsorb (with essentially an infinite residence time) a monolayer of TMG prior to electron beam irradiation. This low temperature is a substantial deviation from normal EBID processes occurring near room temperature and would be a limitation for industrial-scale applications of this process.

While water vapor and oxygen containing gases have been used to purify metal films deposited from organometallic precursors, such gases can oxidize the deposited material or the substrate, and they typically reduce material growth rates. Noble metals such as gold and platinum would not be expected to show oxidation effects; however many other films of interest would be expected to form deleterious surface oxides during any beam-induced deposition process employing oxygen.

SUMMARY OF THE INVENTION

An object of the invention is to provide improved beam-induced processing.

One aspect of some embodiments of the present invention is the application of novel purification compounds enabling the removal of contaminants during electron beam-induced deposition, ion beam-induced deposition, and laser beam-induced deposition. Another aspect of some embodiments of the present invention is the use of novel compounds for real-time inhibition of oxidation during the deposition or etching of oxidizable materials.

In preferred embodiments, compounds that contain hydrogen and nitrogen, such as ammonia, amines, amides, hydrazine, or compounds derived by insertion of organic substituents in place of one or more of the hydrogen atoms in these nitrogen-containing compounds, are used to enhance beam-induced deposition or etching. We refer to these compounds as 'film purification compounds (FPCs)' in the following. In preferred embodiments of the invention, the FPC does not reduce the growth rate of a beam-induced deposition process. Another aspect of some embodiments of the present invention is the application of novel etch precursor gases enabling the selective etching of carbon-containing materials during beam-induced etching.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

The present invention is applied to beam-induced processing, such as beam-induced etching or beam-induced deposition. The invention can be used with electron beams, ion beams, laser beams, cluster beams, and neutral particle beams. While the examples provided below describe primarily EBID and EBIE to illustrate the invention, skilled persons can determine from those illustrations how to use the invention with other types of beams, and the invention is not limited to use with electron beams. For example, the invention can be used with an ion beam system having a liquid metal ion source or a plasma ion source.

The chemical reactions described below represent the applicants understanding of how various embodiments of the invention function and are presented to assist a skilled person in extending the example described herein to other embodiments, but the invention has been shown to work, regardless of whether or not applicants' understanding of the underlying theory is correct.

Figure 1:
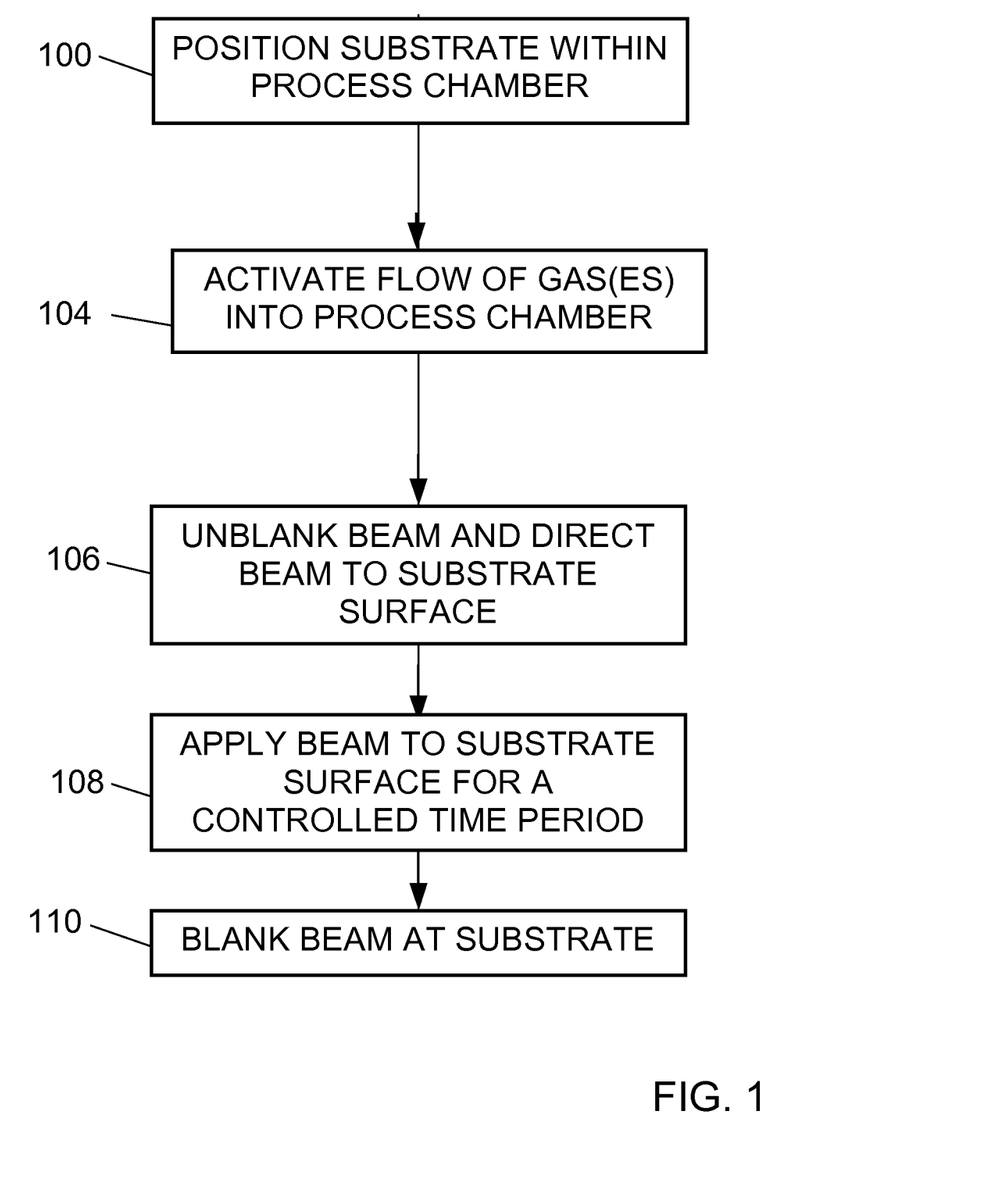
FIG. 1 shows a flow chart for a beam-induced deposition or etching process, such as electron beam-induced deposition (EDID) or electron beam-induced etching (EBIE), in accordance with an embodiment of the present invention.

FIG. 1 shows the steps of a preferred method embodiment of the present invention. In step 100, the substrate is positioned within a process chamber that has been pumped down to a high vacuum to reduce the concentrations of background gases which might contaminate the growing film or interfere with the beam used for processing. While the work piece is preferably maintained at room temperature, it may also be heated or cooled in various embodiments. In step 104, a valve is opened to admit one or more gases into the process chamber. In accordance with some embodiments of the invention, the gases include a deposition or etch precursor gas and a FPC, preferably a nitrogen-containing reducing gas. The embodiments below describe mainly deposition processes. The deposition precursor gas and FPC are preferably applied simultaneously to both deposit and purify the film simultaneously as it is being grown on the substrate. In some configurations, these gases are separately admitted into the chamber, each from its own supply system. In other configurations, the deposition precursor gas and FPC are premixed before being admitted into the sample chamber, thereby enabling more precise control of the relative concentrations of the gases to optimize the overall deposition process with respect to deposition rate and final film purity. Separately admitting the gases into the deposition process chamber makes it difficult to control the concentration of the FPC relative to the deposition precursor gas, which makes it more difficult to optimize the overall deposition process efficiency with respect to deposition rate and film purity. Excessive amounts of deposition precursor gas relative to the FPC may result in impure films due to inadequate film purification during deposition. Excessive amounts of the FPC relative to the deposition precursor gas may result in sub-optimal film deposition rates. By employing precise co-injection or premixing methods, this prior art limitation is avoided in the present invention.

In many applications, the deposition precursor gas and/or etch precursor gas is mixed with a carrier gas. Typically carrier gases should be chemically inert with respect to the precursor gas, the FPC, and the work piece surface. A noble gas, such as argon, is typically chosen because noble gases are inert to almost all chemical reactions. However, in some cases, a single gas (e.g., $H_2$) may function as both carrier gas and FPC. The carrier gas used with the deposition precursor gas may differ from the carrier gas used with the FPC, and in some cases, only the deposition precursor gas or FPC may be mixed with a carrier gas, while the FPC or deposition precursor gas, respectively, would be used without a carrier gas. References in this application to applying a precursor or FPC may include applying a mixture of the gas with a carrier gas.

In some embodiments, the work piece is maintained in a sample chamber in a high vacuum and the gases are injected near the surface of the work piece, with the concentration of the gases being higher at the work piece surface than that in the rest of the sample chamber. In other embodiments, such as in an environmental scanning electron microscope, the work piece surface is maintained in a volume that is filled with the precursor gas and/or the FPC. Unlike a charged particle beam, a laser does not require that the sample be maintained in a vacuum. Various embodiments are described in more detail below.

In step 106, the beam is turned on (or unblanked) and is directed to the work piece surface, either normally or at an angle, thereby inducing one or more chemical reactions of the precursor gas and the FPC at the surface. In step 108, the beam is applied for a controlled time period—this period may be predetermined or determined in real-time, automatically or by a user, using signals from a beam raster system.

In some embodiments, the substrate is sequentially processed with the deposition precursor gas and then the FPC. A deposition precursor gas is then admitted into the chamber and the beam is directed toward the substrate for a period of time, thereby initiating the deposition process, after which the beam is ceased. The deposition precursor gas flow is then turned off and the FPC is turned on. Optionally, the chamber is pumped for a predetermined amount of time before the FPC is turned on to remove nearly all remnants of the deposition precursor gas. The beam is then turned on again, activating the film purification process. After a predetermined period of time, the beam is turned off and the FPC flow turned off. Using one or more in situ film analysis techniques, the thickness of the deposited film can then be measured and the film composition possibly characterized as well. If the deposited film has the desired thickness and composition, then the deposition process is complete. If the film does not have the desired properties, the above process is repeated. If only one cycle is necessary, the process is sequential. If a multiplicity of cycles is necessary, the process is alternating.

In step 110, the beam application is stopped, for example, by blanking the beam. A user may analyze the deposited film to determine if the process is complete; if not, then the beam is positioned at the desired location on the substrate, then processing continues with step 106 above. If processing is complete, the gases are shut off.

While the present invention can use any type of beam, one preferred embodiment described below includes electron beam-induced deposition and/or electron beam-induced etching.

Choice of Deposition Precursor Gas

Many deposition precursor gases are known and described, for example, in Orloff, *Handbook of Charged Particle Optics*, CRC Press (1997). There are a number of preferred characteristics for the various deposition precursor gases which make for a practical EBID process:

(A) When decomposed, the deposition precursor gas should deposit atoms of the desired species (e.g., tungsten deposited from tungsten hexacarbonyl, or platinum deposited from tetrakis trifluorophosphine platinum);

(B) When decomposed, the deposition precursor gas should not deposit an excessive number of atoms other than those desired in the deposited film (e.g., carbon atoms in a tungsten film produced by decomposition of $W(CO)_6$);

(C) The deposition precursor gas should be volatile at temperatures suitable for the EBID process (e.g., the precursor can not be heated to temperatures at which the precursor vapor would condense to form films on the surfaces of the process chamber, and the deposition process cannot take place at substrate temperatures which would induce thermal damage to the substrate);

(D) The deposition precursor gas should not significantly thermally decompose at temperatures meeting the criterion in (C), above, (i.e., the deposition precursor gas must not undergo thermal CVD, in addition to EBID);

(E) The deposition precursor gas should not be excessively corrosive to the gas delivery system, process chamber, electron beam column, or substrate;

(F) The deposition precursor gas may also need to meet various other chemical and physical requirements for suitability in EBID (these requirements may differ for R&D applications, as compared with commercially-viable large volume applications); and (G) The deposition precursor gas must not react spontaneously (i.e., in the absence of the electron, ion or laser beam) with the carrier gas or FPC (or a mixture of the two) at temperatures meeting the criterion in (C) above.

Because of the specific requirements for a deposition precursor gas for beam-induced processing, many gases that are used for processing an entire wafer are not suitable for charged particle or other beam processing because, for example, they may react spontaneously with the substrate in the absence of the charged particle beam or they may not have a high enough sticking coefficient or long enough desorption time to permit activation by the charged particle beam. It can be very difficult to find or design a deposition precursor gas to deposit a specific material. The particular choice of deposition precursor gas for the present invention may be affected by possible interactions between the FPC (or FPC+carrier gas) and the material that is to be deposited on the substrate surface from the deposition precursor gas. Precursors used with different types of beams may interact differently with the different beams and therefore have different requirements.

Choice of Film Purification Compound

In accordance with some embodiments of the invention, the quality (e.g., purity, conductivity, homogeneity, etc) of a deposited film is improved by the use of an additional gas to purify the deposited film, often with the specific goal of removing carbonaceous contaminants. These contaminants tend to reduce the electrical conductivity of the film, thereby degrading its performance in many applications.

A preferred FPC is a reducing gas, preferably containing nitrogen, rather than an oxidizing gas (such as $H_2O$ or $O_2$). A "reducing" gas generally contains hydrogen, and may contain other atoms, as well. A number of possible reducing compounds and gas mixtures may be used as FPCs in a beam-induced deposition process. In the context of the present invention, film "purification" means that in a beam-induced deposition process, use of a FPC in conjunction with the deposition precursor gas will produce a film with less contamination (in many embodiments, less carbonaceous contamination), than would be the case in the absence of the FPCs described in this section. Reduction of contamination in the film will generally improve the electrical conductivity of the film. In some cases, the FPC may be premixed with a carrier gas.

Beam-induced deposition methods of the present invention preferably utilize any one or more of a multiplicity of reducing gases based on nitrogen. One hydrogen-containing nitrogen compound is ammonia, $NH_3$, a caustic and hazardous compound with a strong pungent odor, boiling at −33.34° C. Ammonia can be supplied from a pressurized tank, or alternatively from a solid precursor, such as ammonium carbonate, $(NH_4)_2CO_3$, which thermally decomposes to form ammonia and carbonic acid. Applicants have found that ammonia will demonstrate the following desirable characteristics, particularly in comparison with hydrogen as a FPC:
  (i) Under electron beam irradiation, $NH_3$ gives rise to reactions that readily convert carbon into volatile molecules, such as $CH_4$; this property is believed to arise from the following characteristics of the ammonia molecule and its adsorbed dissociation products:
    (a) The ammonia molecule has a pronounced dipole moment, thereby enhancing the adsorption of ammonia to many substrate surfaces and increasing the surface residence time through hydrogen bonding; and
    (b) Ammonia does not dissociate into two species that have a strong tendency to recombine on the surface;
  (ii) Under electron beam irradiation, $NH_3$ does not produce adsorbed oxygen atoms, which could cause oxidation of the substrate during EBID;
  (iii) Ammonia as a FPC can be mixed with numerous EBID precursors (deposition precursor gases) without the decomposition reactions that would occur when $H_2O$ is used as a film purification compound; and
  (iv) The presence of $NH_3$ as a FPC can increase deposition rates, in contrast to the case with $H_2O$ or $O_2$, both of which decrease deposition rates; this property is highly beneficial since EBID processes exhibit very low volumetric growth rates, a characteristic that limits the applicability of EBID. The mechanism behind the $NH_3$-induced EBID growth rate enhancement is believed to be a H-induced increase in the surface diffusivity of the deposition precursor gases.

The next most complex category of hydrogen-containing nitrogen FPC compounds are the amines, wherein one, two, or all three, of the hydrogen atoms in the ammonia molecule have been replaced by organic substituents such as alkyl or aryl groups. When exactly one hydrogen atom in ammonia is replaced, the resulting compound is a primary amine, examples including methylamine, ethanolamine, propanolamine, etc. When two hydrogen atoms are replaced (not necessarily by identical substituents), the resulting compound is a secondary amine, examples including dimethylamine, methylethanolamine, and cyclic amines such as aziridine. Replacement of all three hydrogen atoms (again, not necessarily by identical substituents) results in a tertiary amine, examples including trimethylamine, dimethylethanolamine, etc. The primary and secondary amines retain two or one hydrogen atoms, respectively, leaving the resulting molecule capable of hydrogen bonding. A partial exception to this rule occurs for aromatic amines, where the lone pair of electrons on the nitrogen atom is conjugated to the benzene ring. Depending on the complexity and size of the substituents, amines can be liquid or gaseous at room temperature and pressure.

Another category of hydrogen containing FPC molecules are the amides, with the generic formula $R_1(CO)NR_2R_3$, where either or both of $R_2$ and $R_3$ may be hydrogen. A potential disadvantage of using amides as FPCs is the possibility of surface oxidation arising from adsorbed O atoms generated by electron beam-induced dissociation of the adsorbed amide molecules.

Ionic nitrogen compounds containing hydrogen may also be useful as FPCs. Examples include ammonium hydroxide, $NH_4OH$, and ammonium carbonate, $(NH_4)_2CO_3$. Ammonium hydroxide is safer than pure ammonia; however, use of this compound inevitably will introduce undesirable water contamination on the substrate surface. Ammonium carbonate is a solid at room temperature, and thus is more suited for use in some gas injection systems than ammonia; however, this compound has a limited vapor pressure at room temperature.

In all of the above hydrogen-containing compounds, there is a single nitrogen atom. Obviously, more complex FPC compounds are possible, containing two or more nitrogen atoms, such as hydrazine, $N_2H_4$, as well as compounds derived therefrom by replacement of one to all four of the hydrogen atoms, as was the case for the amines and amides (again, wherein the multiple substituents need not be the same). Hydrazine is highly toxic and dangerously unstable, typically being handled as an aqueous solution for safety purposes. Hydrazine and compounds derived therefrom still containing at least one hydrogen atom are capable of hydrogen bonding, with correspondingly enhanced adsorption and residence times on some substrate surfaces.

It is also possible to utilize a gas mixture to supply the FPC for the enhanced EBID process. For example, "forming gas", a mixture of nitrogen and hydrogen (up to 5.7%) is commonly used to provide a reducing atmosphere, where the limited amount of hydrogen prevents an explosion hazard.

Any of the above molecules may also be combined with a "carrier gas", such as Ar, in a mixture (FPC+carrier gas) for an EBID process.

EBID and/or EBIE Process Chamber Configurations

Figure 3:
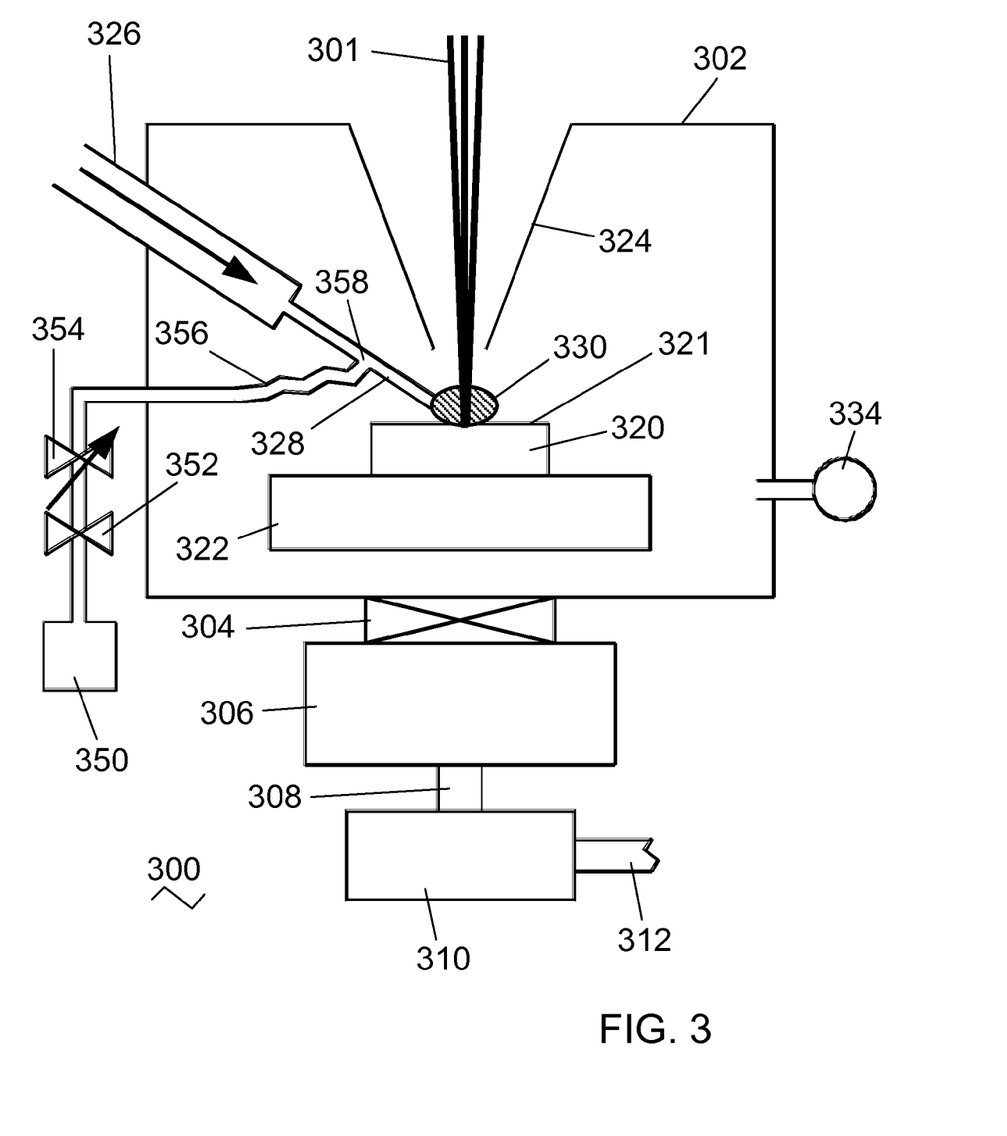
FIG. 3 shows an EBID/EBIE system comprising a capillary GIS, also comprising a means for premixing a deposition or etch precursor gas with a FPC and/or carrier gas, prior to injection of the combined gases into the EBID process chamber.
Figure 4:
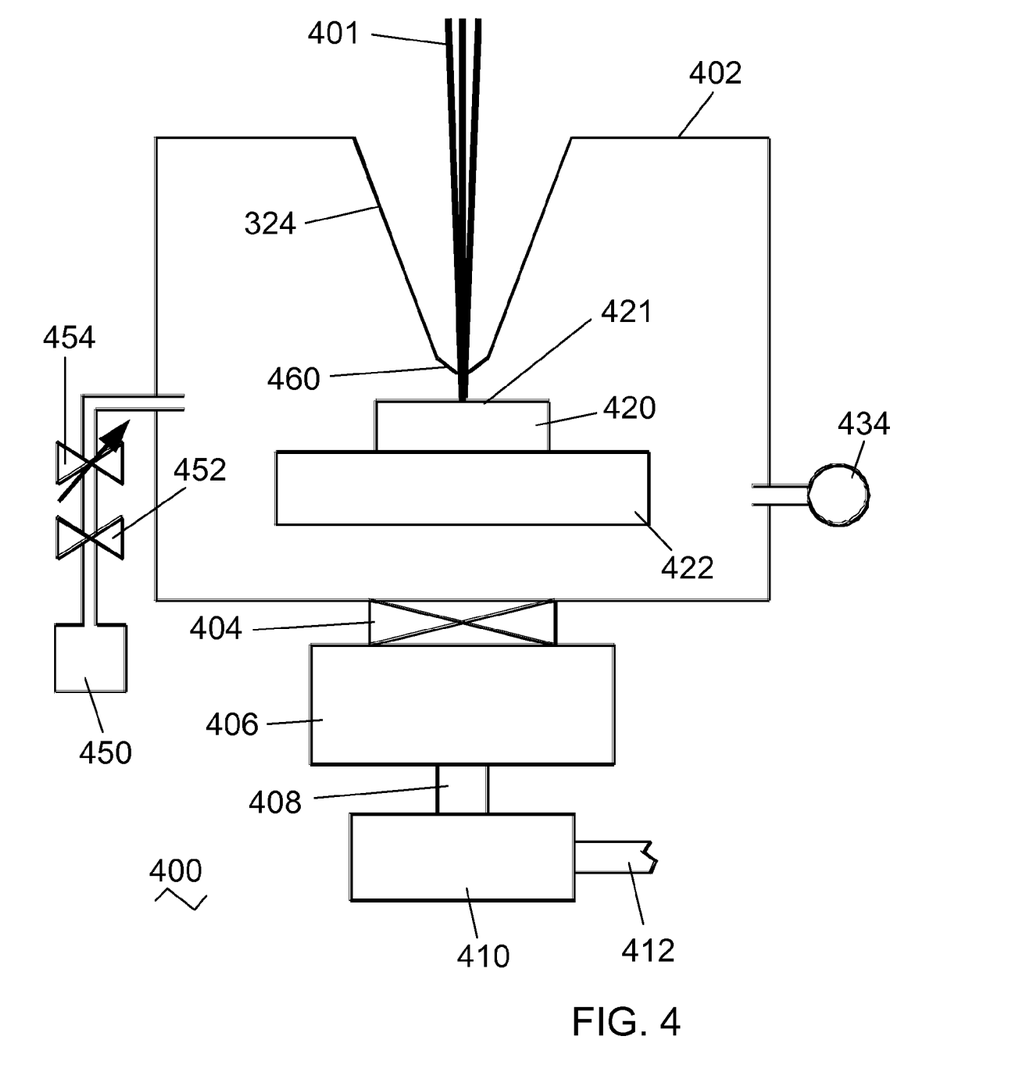
FIG. 4 shows an EBID/EBIE system utilizing an environmental scanning electron microscope to perform beam chemistry in accordance with an embodiment of the invention.
Figure 5:
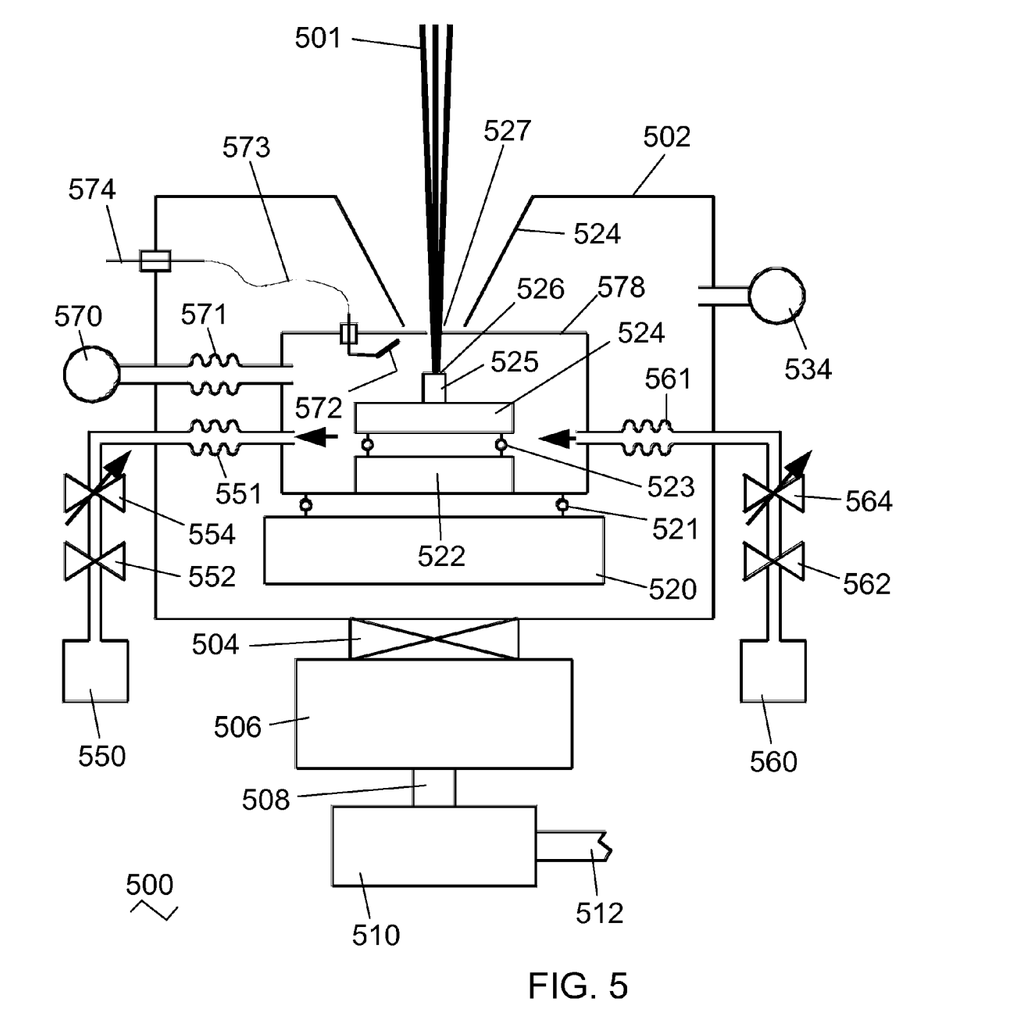
FIG. 5 shows an EBID/EBIE system utilizing an internal environmental chamber to isolate the vacuum at the substrate from possible process chamber background gas contamination.

FIGS. 2-5 show various EBID/EBIE process chamber configurations. The configuration of a process chamber for employing EBID and/or EBIE to form patterned structures on a substrate can be characterized by a number of design and operating parameters:
  (A) The electron beam column design—this includes column design aspects such as the degree of differential pumping between the electron source (typically requiring vacuums in the $10^{-9}$ torr range) and the chamber containing the substrate, the incidence angle of the focused electron beam with respect to the substrate surface, the size and energy ranges of the beam at the substrate, and methods for imaging the substrate during the EBID process,
  (B) The method of introducing the process gases, including both the deposition precursor gas and any other additional gases, such as an FPC or a carrier gas—this includes whether the process gases are introduced into the entire chamber (FIG. 4), introduced by means of a capillary mounted near the intersection of the electron beam with the substrate surface (FIGS. 2 and 3), or are introduced into a small inner vacuum enclosure within the overall vacuum chamber (FIG. 5), and
  (C) Whether the substrate is in the main process chamber (FIGS. 2-4), or is contained in a separate environmental enclosure, within the main chamber (FIG. 5).

The preferred chamber design employed for EBID and/or EBIE depends on the application.

The particular system configurations shown in FIGS. 2-5 are for illustrative purposes only—any one of the systems in FIGS. 2-5 may be used to implement the method of the present invention and are not part of the present invention. Modifications to the illustrated systems which are familiar to those skilled in the art may also be used to implement the method of the present invention.

Figure 2:
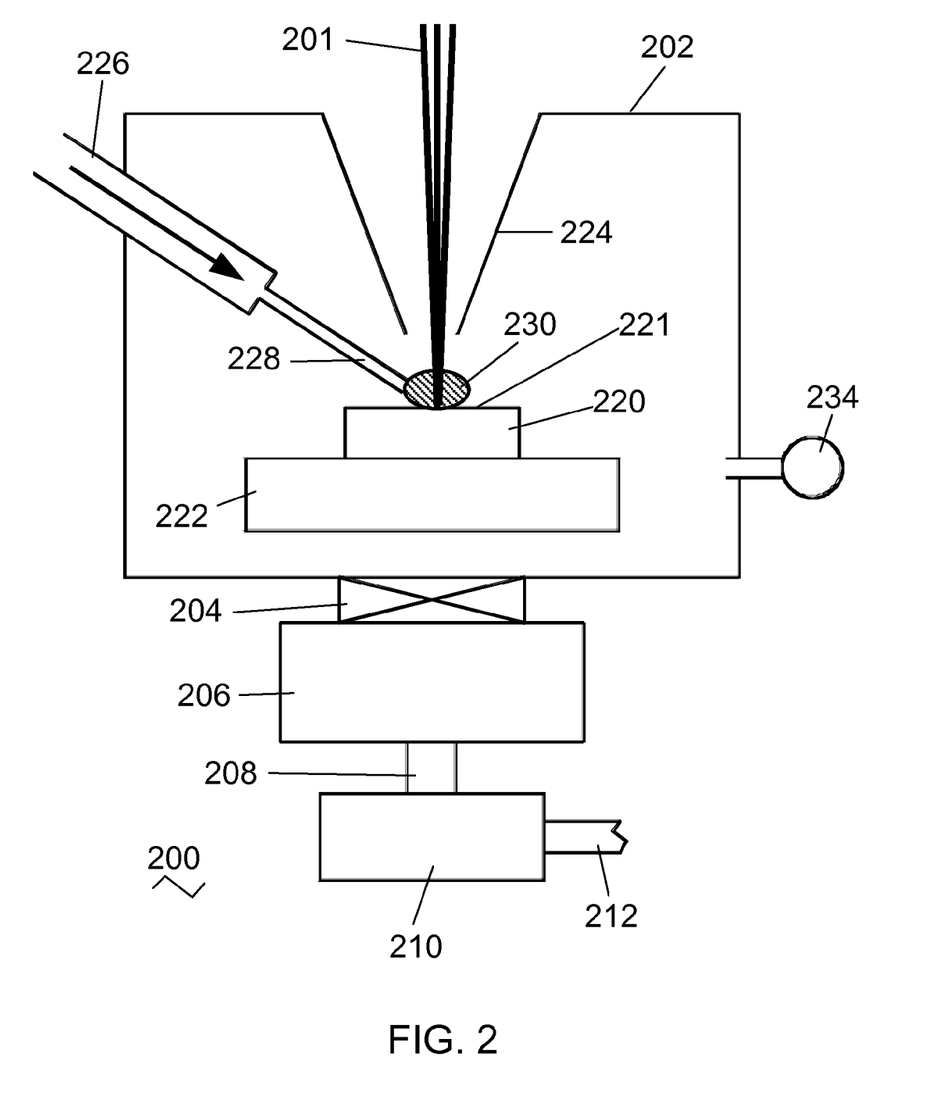
FIG. 2 shows an EBID/EBIE system comprising a capillary gas injection system (GIS).

FIG. 2 is a schematic illustration of a process chamber 200 for conventional electron beam chemistry, including both EBID, as well as electron beam-induced etching (EBIE). An electron beam 201 is generated by an electron column (not shown), typically comprising an electron source, lenses, deflectors, blankers, and apertures, as is familiar to those skilled in the art. In FIG. 2, electron beam 201 is shown being directed normally to the surface 221 of a substrate 220, however, in some applications, electron beam 201 may preferably be directed towards the substrate surface 221 at an angle to the normal. Substrate 220 is supported by a movable stage 222, enabling electron beam 201 to strike different areas on substrate surface 221. The substrate 220 and stage 222 are mounted within a high vacuum chamber 202 pumped by a high vacuum pump (typically a turbomolecular pump) 206 through a chamber isolation valve 204. High vacuum pump 206 is backed by backing pump 210 through backing line 208, with the exhaust from pump 210 exiting the system 200 through exhaust line 212. Vacuum levels within chamber 202 are monitored by one or more gauges (each reading over a specific range of vacuum levels), shown schematically by a single gauge tube 234. Process gases (comprising deposition precursor gases and possibly FPCs and carrier gasses as envisioned in the present invention) flow through a gas injection system (GIS) 226 where they are premixed and then are directed by a capillary 228 towards the substrate surface 221 near the landing region of electron beam 201. A reservoir, stop valve, and regulator valve (not shown) may comprise other portions of the GIS. System 200 is applicable for use in the method of the present invention in cases where the deposition precursor gas, FPC and carrier gas process gases may be mixed within the GIS (i.e., relatively distant from the substrate 220). In cases where gas mixing must occur nearer the substrate, system 300 in FIG. 3 would be preferred. The deposition precursor is typically solid or liquid at room temperature, and is optionally cooled or heated in order to control the rate at which gas molecules flow to the substrate, or to ensure that the gases flowing through system 226 and tube 228 do not condense during processing. The final pole piece 224 of the objective lens in the column may comprise part of the overall high vacuum enclosure, thereby enabling shorter working distances between the objective lens and the substrate surface 221. Shorter working distances have the advantage of (1) reducing the source-to-substrate magnification, thereby enabling smaller beams to be generated, and (2) reducing electron-gas scattering occurring above the substrate surface 221, thereby increasing the beam current at the substrate 220 available for EBID or EBIE processes. A region 230 directly above the substrate has a locally higher pressure of process gases due to the action of capillary 228. With the chamber isolation valve 204 open, chamber 202 is actively pumped, typically giving chamber base pressures in the $10^{-6}$ to $10^{-7}$ mbar range. During processing, the chamber pressure may be in the $10^{-5}$ mbar range, while the local pressure in region 230 may be near $10^{-3}$ mbar.

Advantages of system configuration 200 include potentially higher deposition or etching rates due to enhanced process gas pressures in region 230 (compared with the average background pressures in the overall chamber 202). Disadvantages include (1) the need for a capillary 228, and, in particular, for careful positioning of the end of capillary 228 relative to the beam 201 landing area (possibly restricting the size of the scan field of the electron beam 201 at the substrate surface 221), (2) an inability to measure directly the deposition precursor gas pressure at the point where the electron beam 201 intersects the surface 221, and (3) the potential for film contamination during growth, since the substrate surface 221 is exposed to background gas species within chamber 202.

FIG. 3 is a schematic illustration of an alternative process chamber 300 for conventional electron beam chemistry to that in FIG. 2, enabling premixing of the deposition precursor gas, FPC and (optionally) carrier gas much nearer to substrate 320 than is possible using system 200 in FIG. 2. An electron beam 301 is generated by an electron column (not shown) and the same beam directional considerations as in FIG. 1 apply here. Substrate 320 is supported by a movable stage 322, enabling electron beam 301 to strike different areas on substrate surface 321. Substrate 320 and stage 322 are mounted within a high vacuum chamber 302 pumped by a high vacuum pump (typically a turbomolecular pump) 306 through a chamber isolation valve 304. High vacuum pump 306 is backed by backing pump 310 through backing line 308, with the exhaust from pump 310 exiting the system 300 through exhaust line 312. Vacuum levels within chamber 302 are monitored by one or more gauges (each reading over a specific range of vacuum levels), shown schematically by a single gauge tube 334. Process gases (comprising deposition precursor gases and possibly FPCs and carrier gases as envisioned in the present invention) flow through a gas injection system (GIS) 326 and then are directed by a capillary 328 towards the substrate surface 321 near the landing region of electron beam 301. A reservoir, stop valve, and regulator valve (not shown) may comprise other portions of the GIS. The deposition precursor is typically solid or liquid at room temperature, and is optionally cooled or heated in order to control the gas flow rate, or to ensure that the gases flowing through system 326 and capillary 328 do not condense during processing. Additional process gases may be supplied through a feed system comprising a reservoir 350, a stop valve 352, and a regulator (throttle) valve 354. For process gases that are volatile at room temperature, reservoir 350 may be a tank containing the process gas (which may be a mixture of two or more gases). For process gases that are solid or liquid at room temperature, reservoir 350 may be heated or cooled to improve volatility or prevent condensation during processing. The process gases are combined at a junction 358 within capillary 328, and premix while flowing through the portion of capillary 328 between junction 358 and region 330, prior to being injected into region 330 directly above the substrate surface 321 at the electron beam 301 landing area. As in FIG. 2, the final pole piece 324 of the objective lens in the column may comprise part of the overall high vacuum enclosure. The same chamber and process gas pressure considerations apply here as for FIG. 2.

The advantages and disadvantages of system configuration 300 are similar to those for configuration 200, but with improved capabilities for film growth enabled by the addition of the second gas feed capability. This added capability requires added system complexity, which adds costs and potentially reduces reliability, however.

The system shown in FIG. 2 can optionally include more than one GIS 226, whereby each GIS is directed towards the surface 221 so that the gases delivered by the GIS's mix within the volume 230.

FIG. 4 is a schematic illustration of a process chamber 400 for electron beam chemistry (again, EBID and/or EBIE) in an environmental scanning electron microscope. In this approach, instead of introducing the process gases only near the substrate surface 421 with a capillary, here the entire chamber 402 is back-filled with process gases through a feed system comprising a reservoir 450, a stop valve 452, and a regulator (throttle) valve 454. In FIG. 4, "process gases" may be interpreted to include a deposition precursor gas, a FPC, and (optionally) a carrier gas. For process gases that are volatile at room temperature, reservoir 450 may be a tank containing the process gas (which may be a mixture of two or more gases). For process gases that are solid or liquid at room temperature, reservoir 450 may be heated or cooled to improve volatility or prevent condensation during processing. Substrate 420 is supported by a movable stage 422, enabling electron beam 401 to strike different areas on the substrate surface 421. Substrate 420 and stage 422 are mounted within a vacuum chamber 402 pumped by a high vacuum pump (typically a turbomolecular pump) 406 through a chamber isolation valve 404. High vacuum pump 406 is backed by a backing pump 410 through backing line 408, with the exhaust from pump 410 exiting the system 400 through exhaust line 412. Vacuum levels within chamber 402 are monitored by one or more gauges (each reading over a specific range of vacuum levels), shown schematically by a single gauge tube 434. As in FIGS. 2 and 3, the final pole piece 424 of the objective lens in the electron column (not shown) may be part of the overall vacuum enclosure. The difference for the chamber configuration in FIG. 4, however, is that since the entire chamber is filled with process gases, it is necessary to introduce an aperture 460 into the bottom end of pole piece 424 to restrict the flow of process gases (and also any volatile products) up into the electron column. Typically, several additional apertures may be placed along the optical axis of the column, each enabling one or more orders of magnitude of vacuum isolation. This chamber configuration is typical of an environmental scanning electron microscope, thus processes performed in such a chamber are commonly termed "ESEM® beam chemistry". During processing, the pressure within chamber 402 may be in the range 0.1 to 20 torr with the chamber isolation valve 404 closed. During processing, the chamber 402 may be rough pumped (using a pump not shown in FIG. 4) to reduce the steady-state background impurity concentration, thus reducing incorporation of impurities in the growing film as is familiar to those skilled in the art.

Advantages of system configuration 400 include (1) a simplified process gas injection system (GIS), without the need for a capillary near the substrate surface 421, (2) the ability to achieve greater deposition precursor gas pressures at the point where the electron beam 401 intersects the surface 421, (3) the ability to measure directly the deposition precursor gas pressure at the point where the electron beam 401 intersects the surface 421, and (3) the ability to charge-stabilize substrates 420 that are electrical insulators. Disadvantages include a risk of increased column and chamber contamination due to the higher pressures in chamber 402, relative to configurations 200 and 300.

FIG. 5 illustrates a second, more complex, process chamber 500 for ESEM beam chemistry as described in U.S. patent application Ser. No. 12/525,908 for "High Pressure Charged Particle Beam System," which is assigned to the assignee of the present invention and which is hereby incorporated by reference. A substrate 525 is located inside an environmental chamber 578 which is shown mounted on an X-Y-Z translation stage 520 located inside process chamber 502. Environmental chamber 578 contains a pressure limiting aperture (PLA) 527 that enables the transfer of electron beam 501 to substrate 525. Stage 520 is used to position the environmental chamber 578 and PLA 527 with respect to electron beam 501. Substrate 525 is connected to an X-Y-Z substage 522 which is used to position the substrate 525 with respect to the electron beam 501, independently of the PLA 527. Substage 522 is necessary when PLA 527 is smaller than the desired area on which EBID and/or EBIE of substrate surface 526 is to be performed. In an alternative embodiment, substrate 525 may be mounted directly to an interior surface of environmental chamber 578. A high vacuum pump (typically a turbomolecular pump) 506 pumps chamber 502 through a chamber isolation valve 504. High vacuum pump 506 is backed by backing pump 510 through backing line 508, with the exhaust from pump 510 exiting the system 500 through exhaust line 512. Vacuum levels within chamber 502 are monitored by one or more gauges (each reading over a specific range of vacuum levels), shown schematically by a single gauge tube 534. Vacuum levels within the environmental chamber 578 are monitored by one or more gauges (each reading over a specific range of vacuum levels), shown schematically by a single gauge tube 570—note that due to the mechanical motion of chamber 578 (enabled by SEM stage 520), gauge tube 570 must have a flexible vacuum connection 571 to chamber 578. As in FIGS. 2-4, the final pole piece 524 of the objective lens in the electron column (not shown) may be part of the overall vacuum enclosure. Substrate 525 may optionally be supported on a hot/cold stage 524 enabling control of the substrate temperature during processing. Sample heating or cooling can improve gas-mediated processes by, for example improving film purity or increasing process rates. Hot/cold stage 524 is supported by thermal insulators 523 that connect to substage 522 within an environmental chamber 578. A second level of thermal isolation is provided by insulators 521 that support chamber 578 on SEM stage 520 within process chamber 502. Chamber 578 is optionally heated to prevent precursor condensation onto inner surfaces of chamber 578 at high gas pressures, and to assist gas-mediated processes such as in-situ CVD.

After high vacuum pumping (to remove background gases) from both the chamber 502 and environmental chamber 578, environmental chamber 578 is back-filled to pressures in the range of 0.1 to 20 torr with process gases through a feed system comprising a reservoir 560, a stop valve 562, and a regulator (throttle) valve 564. In FIG. 5, "process gases" may be interpreted to include a deposition precursor gas, carrier gas and FPC, or a mixture of deposition precursor gas, carrier gas and FPC. Note that due to the mechanical motion of chamber 578, a flexible tube 561 connects the process gas feed system to environmental chamber 578. For process gases that are volatile at room temperature, reservoir 560 may be a tank containing the process gas (which may be a mixture of two or more gases). For process gases that are solid or liquid at room temperature, reservoir 560 may be heated or cooled to control the precursor vapor pressure.

Environmental chamber 578 also has a separate pumping system, comprising a flexible tube 551 (to accommodate motion of chamber 578 on stage 520), a throttle valve 554, a stop valve 552, and a pump 550. Unlike the situation in FIG. 4, for this configuration, the main chamber 502 may be continually pumped by high vacuum pump 506 through chamber isolation valve 504, or, alternatively, by a separate roughing pump (not shown). During EBID and/or EBIE, the substrate may be imaged using an electron detector 572, connected through flexible electrical connection 573 (to accommodate motion of chamber 578) to external cable 574. The operation of detector 572 is discussed in Toth, M., et al., Appl. Phys. Lett. 91, 053122 (2007) and Thiel, B. L., and Toth, M., J. Appl. Phys. 97, 051101 (2005).

Advantages of the more complex system illustrated in FIG. 5 include (1) more efficient use of process gases as the internal volume of environmental chamber 578 can be significantly smaller than that of chamber 402, (2) the ability to rapidly pump out and switch between different types of process gases since the internal surface area of environmental chamber 578 can be significantly smaller than that of chamber 402, (3) the ability to use chemically aggressive gases that, in large quantities, are detrimental to components typically employed inside SEM chambers such as chamber 402, and (4) the ability to use very high gas pressures that would lead to condensation onto inner surfaces of the SEM chamber 402, (5) improved process purity as the evacuated process chamber 502 acts as a vacuum jacket around chamber 578. Disadvantages include increased system complexity, thereby increasing costs and potentially reducing system reliability.

The systems shown in the Figures can be used for depositing a material on a work piece surface, using the steps of:

providing a deposition precursor gas at the work piece surface;

providing a purification compound including a nitrogen-containing reducing compound toward the work piece surface; and directing a beam toward a local region on the work piece surface, the beam causing decomposition of the precursor gas to fabricate a deposit on the work piece surface, the deposited material including a contaminant, the beam inducing a chemical reaction between the purification compound and the material deposited on the substrate to remove the contaminant and provide a deposited material that includes less contamination than a material deposited using the same methodology but without using a purification compound.

The preferred pressure maintained in vacuum chamber will vary with the compounds used and the application. In some embodiments, the work piece is positioned in a sample chamber including a deposition precursor gas and a purification compound, the overall pressure in the chamber being greater than 0.001 mbar pressure or greater than 0.1 mbar.

The beam preferably has a spot size on the work piece of less than 1 micron and more preferably less than 100 nm.

Aspects of Beam-Induced Etching Systems and Processes

There are many similarities between beam-induced deposition systems and processes as described in the preceding section and the corresponding systems and processes for beam-induced etching. A three-aspect characterization may be made:

(1) The physical configuration of the process chamber,
(2) The choice of etch precursor gas, and FPC (the latter used for oxidation inhibition of the material to be etched)
(3) (Optionally) a carrier gas to be used to aid transport of the etch precursor gas to the area to be etched.

In general, the possibilities for (1) are the same: etch and deposition process chambers may have the same physical configurations. In (2), for etching, the deposition precursor gas used for deposition is replaced by the required etch precursor gas and optionally, a FPC which acts to inhibit oxidation of the material to be etched. The various nitrogen-based reducing gases discussed above as FPC candidates are also appropriate choices for etch precursor gases, particularly to etch carbon-containing materials, such as diamond or photoresist. For (3), carrier gas considerations for etch precursor gases are also essentially the same as those for the deposition processes using deposition precursor gases.

As with beam-induced deposition, beam-induced etching can use a charged particle beam, such as an electron beam or ion beam, a laser beam, a cluster beam, a neutral beam or other beam. The beam is preferably focused to provide a small spot size that depends on the type of beam. For example, an electron beam preferably forms a spot size of less than 100 nm or less than 10 nm. Nitrogen containing reducing gases can be used not only as the etch precursor gas, but can also be used with other etch precursor gases to inhibit oxidation of the work piece.

Thus, the systems shown in the figures can be used for processing a work piece using a focused beam, using the steps of:

providing a nitrogen-containing reducing etch precursor gas at the surface of a work piece; and directing a beam toward a local region on the work piece, the beam inducing a reaction between the nitrogen-containing reducing etch precursor gas and the work piece material to etch the surface.

The systems shown in the figures provide a beam system for processing a work piece, comprising:

a source of a focused beam;

a source of a deposition or etch precursor gas;

a source of a nitrogen-containing reducing purification compound; and a computer for controlling the beam system, the computer including a memory storing program instructions to provide the deposition or etch precursor gas and the purification compound at the work piece surface and to direct the beam in a predetermined pattern on the work piece to deposit a material by decomposition of the deposition precursor gas and to purify the deposited material by decomposition of the purification compound or to etch the work piece.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of depositing a material on a work piece surface, comprising:

providing a deposition precursor gas at the work piece surface;

providing a purification compound including a nitrogen-containing compound at the work piece surface; and directing a focused particle beam toward a local region on the work piece surface, the beam having a spot size on the work piece surface of less than one micrometer, the beam causing decomposition of the precursor gas to fabricate a deposit on the work piece surface, the deposited material including a contaminant, the purification compound causing a reduction in the concentration of the contaminant and providing a deposited material that includes less contamination than a material deposited using the same methodology but without using a purification compound;

in which the temperature of the work piece is maintained near room temperature while forming the deposit.

2. The method of claim 1 in which the purification compound is a reducing compound.

3. The method of claim 1 in which the beam comprises an electron beam, an ion beam, a cluster beam, a neutral particle beam, or a laser beam.

4. The method of claim 1 in which the presence of the purification compound does not reduce the material deposition rate.

5. The method of claim 1 in which the purification compound comprises $NH_3$.

6. The method of claim 1 in which the purification compound comprises hydrazine or a substituted hydrazine compound.

7. The method of claim 6 in which the deposition precursor gas comprises a metal and carbon.

8. The method of claim 1 in which the purification compound comprises an amine, a substituted amine compound, an amide, a substituted amide compound, or forming gas.

9. The method of claim 1 in which the work piece is positioned within a sample chamber and in which the precursor gas and the purification compound are directed toward the work piece surface by a nozzle positioned sufficiently near the surface so that the pressures of the precursor gas and the purification compound are greater at the work piece surface than in portions of the sample chamber away from the surface of the work piece.

10. The method of claim 1 in which the work piece is positioned within a sample chamber and in which the precursor gas and the purification compound enter the sample chamber through different openings.

11. The method of claim 1 in which the work piece is positioned in a sample chamber including a deposition precursor gas and a purification compound, the overall pressure in the chamber being greater than 0.001 mbar.

12. The method of claim 1 in which the precursor gas and the purification compound are mixed before entering the vacuum chamber.

13. The method of claim 1, wherein the deposition precursor gas comprises tungsten hexacarbonyl ($W(CO)_6$).

14. The method of claim 1, wherein the deposition precursor gas comprises tetrakis trifluorophosphine platinum.

15. A method of depositing a material on a work piece surface, comprising:
provide a deposition precursor gas at the work piece surface;
providing a purification compound including a nitrogen-containing compound at the work piece surface; and
directing a beam toward a local region on the work piece surface, the beam having a spot size on the work piece surface of less than one micrometer, the beam causing decomposition of the deposition precursor to fabricate a deposit on the work piece surface, the deposited material including a contaminant, the purification compound causing a reduction in the concentration of the contaminant yielding a deposited material that includes less contamination than a material deposited using the same methodology but without using a purification compound, the purification compound not causing a reduction in the deposition rate obtained using the same methodology but without the purification compound;
in which the temperature of the work piece is maintained near room temperature while forming the deposit.

16. The method of claim 15 in which the purification compound comprises $NH_3$.

17. The method of claim 15 in which the purification compound comprises hydrazine or a substituted hydrazine compound.

18. The method of claim 15 in which the purification compound comprises an amine, a substituted amine compound, an amide, a substituted amide compound, or forming gas.

19. The method of claim 15, wherein the deposition precursor gas comprises tungsten hexacarbonyl ($W(CO)_6$).

20. The method of claim 15, wherein the deposition precursor gas comprises tetrakis trifluorophosphine platinum.

21. A method of processing a work piece using a focused beam, comprising:
providing a nitrogen-containing etch precursor gas at the surface of a work piece; and
directing a focused particle beam toward a local region on the work piece, the beam having a spot size on the work piece surface of less than one micrometer, the beam inducing a reaction between the nitrogen-containing etch precursor gas and the work piece material to etch the surface, the nitrogen-containing etch precursor gas causing less oxidation in the work piece than using the same methodology but without using a nitrogen-containing etch precursor gas;
in which the temperature of the work piece is maintained near room temperature while etching the surface of the work piece.

22. The method of claim 21 in which the nitrogen-containing etch precursor gas is a reducing gas.

23. The method of claim 21 in which the nitrogen-containing etch precursor gas comprises $NH_3$.

24. The method of claim 21 in which the nitrogen-containing etch precursor gas comprises hydrazine or a substituted hydrazine compound.

25. The method of claim 21 in which the nitrogen-containing etch precursor gas comprises an amine, a substituted amine compound, an amide, a substituted amide compound, or forming gas.

* * * * *